United States Patent
Yu et al.

(10) Patent No.: US 10,795,270 B2
(45) Date of Patent: Oct. 6, 2020

(54) METHODS OF DEFECT INSPECTION

(71) Applicant: Taiwan Semiconductor Manufacturing Co., Ltd., Hsinchu (TW)

(72) Inventors: Ta-Ching Yu, Zhubei (TW); Shih-Che Wang, Hsin-chu (TW); Shu-Hao Chang, Taipei (TW); Yi-Hao Chen, New Taipei (TW); Chen-Yen Kao, Hsinchu (TW); Te-Chih Huang, Hsinchu (TW); Yuan-Fu Hsu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 329 days.

(21) Appl. No.: 15/833,640

(22) Filed: Dec. 6, 2017

(65) Prior Publication Data

US 2019/0064675 A1 Feb. 28, 2019

Related U.S. Application Data

(60) Provisional application No. 62/550,113, filed on Aug. 25, 2017.

(51) Int. Cl.
*H01L 21/311* (2006.01)
*G03F 7/20* (2006.01)
(Continued)

(52) U.S. Cl.
CPC ....... *G03F 7/7065* (2013.01); *G01N 21/8901* (2013.01); *G01N 21/956* (2013.01);
(Continued)

(58) Field of Classification Search
CPC .................. G03F 7/7065; H01L 21/0275
See application file for complete search history.

(56) References Cited

U.S. PATENT DOCUMENTS

2007/0004193 A1* 1/2007 Wu ................... H01L 21/76808 438/624
2007/0072410 A1* 3/2007 Shin ................. H01L 21/76808 438/622
(Continued)

FOREIGN PATENT DOCUMENTS

| JP | 2013-179270 | 9/2013 |
| TW | 200639943 A | 11/2006 |
| TW | 201522472 A | 6/2015 |

OTHER PUBLICATIONS

Xiao et al.; High-Throughput Contact Critical Dimension and Gray Level Value Measurement; Proc. of SPIE vol. 6152; pp. 61523L-1-61523L-7.

*Primary Examiner* — Mohammad M Choudhry
(74) *Attorney, Agent, or Firm* — McDermott Will & Emery LLP

(57) ABSTRACT

Embodiments of the present disclosure relate to methods for defect inspection. After pattern features are formed in a structure layer, a dummy filling material having dissimilar optical properties from the structure layer is filled in the pattern features. The dissimilar optical properties between materials in the pattern features and the structure layer increase contrast in images captured by an inspection tool, thus increasing the defect capture rate.

19 Claims, 6 Drawing Sheets

(51) Int. Cl.
*G01N 21/956* (2006.01)
*H01L 21/027* (2006.01)
*G01N 21/89* (2006.01)
*G06T 7/00* (2017.01)
*H01L 21/66* (2006.01)
*G01N 21/88* (2006.01)

(52) U.S. Cl.
CPC ........ *G06T 7/0006* (2013.01); *H01L 21/0275* (2013.01); *H01L 22/24* (2013.01); *H01L 22/30* (2013.01); *G01N 2021/8825* (2013.01); *G06T 2207/10061* (2013.01); *H01L 22/12* (2013.01)

(56) References Cited

U.S. PATENT DOCUMENTS

| | | | | |
|---|---|---|---|---|
| 2008/0187842 | A1* | 8/2008 | Hung | ........................ G03F 1/84 430/5 |
| 2008/0220223 | A1 | 9/2008 | Kozawa et al. | |
| 2009/0017630 | A1* | 1/2009 | Lee | ................... H01L 21/76816 438/702 |
| 2012/0113416 | A1* | 5/2012 | Lange | .............. G01N 21/95607 356/237.5 |
| 2012/0264063 | A1* | 10/2012 | Yu | .......................... G03F 7/705 430/313 |
| 2017/0372909 | A1* | 12/2017 | Briggs | ................ H01L 21/3065 |
| 2018/0337046 | A1* | 11/2018 | Shamma | ............ H01L 21/0332 |

* cited by examiner

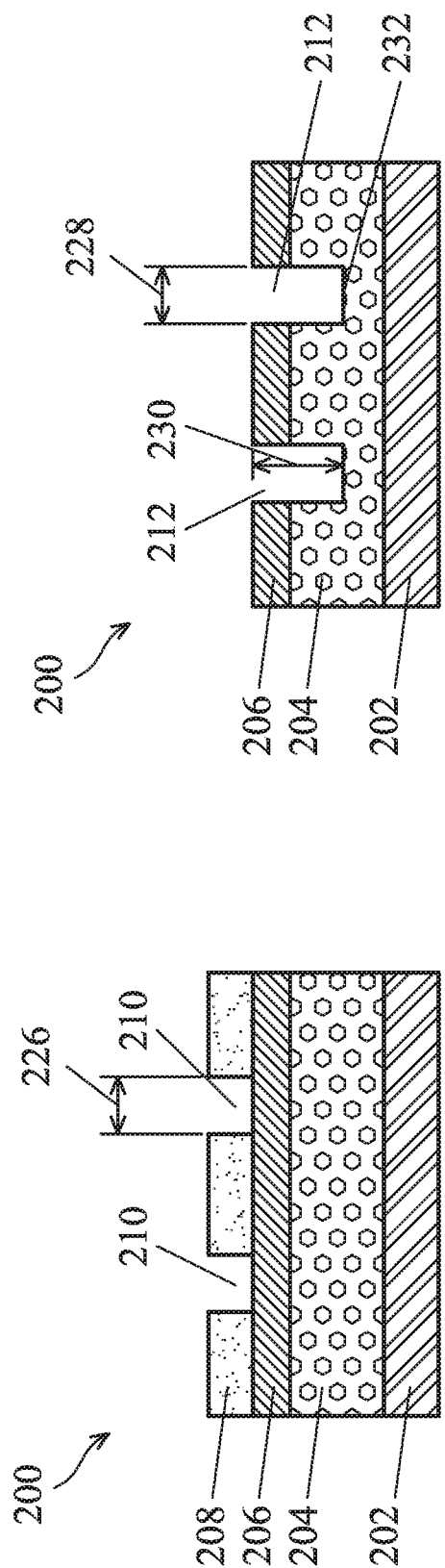
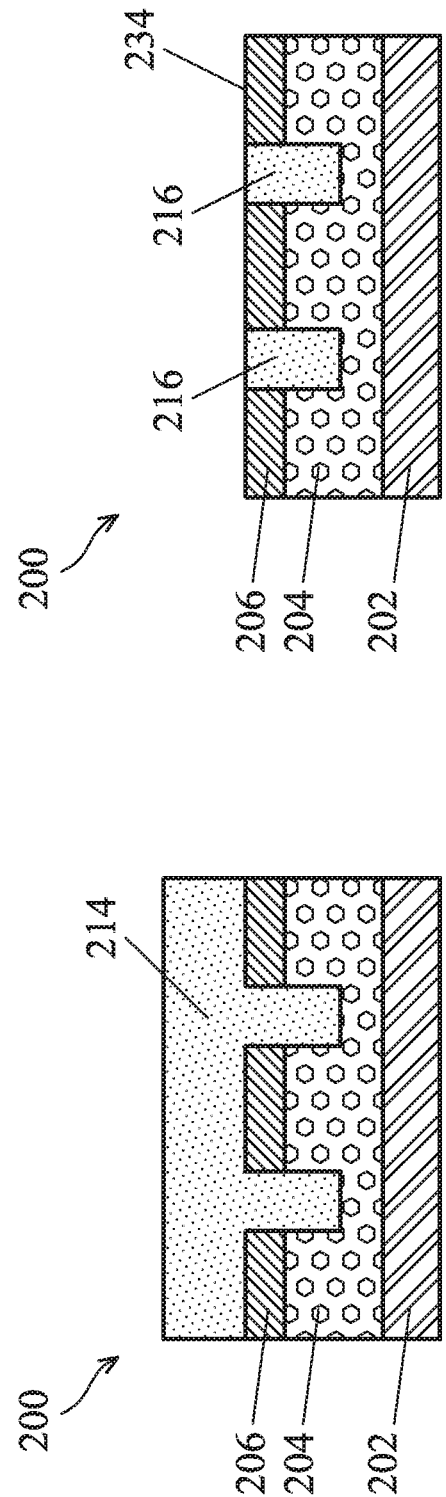

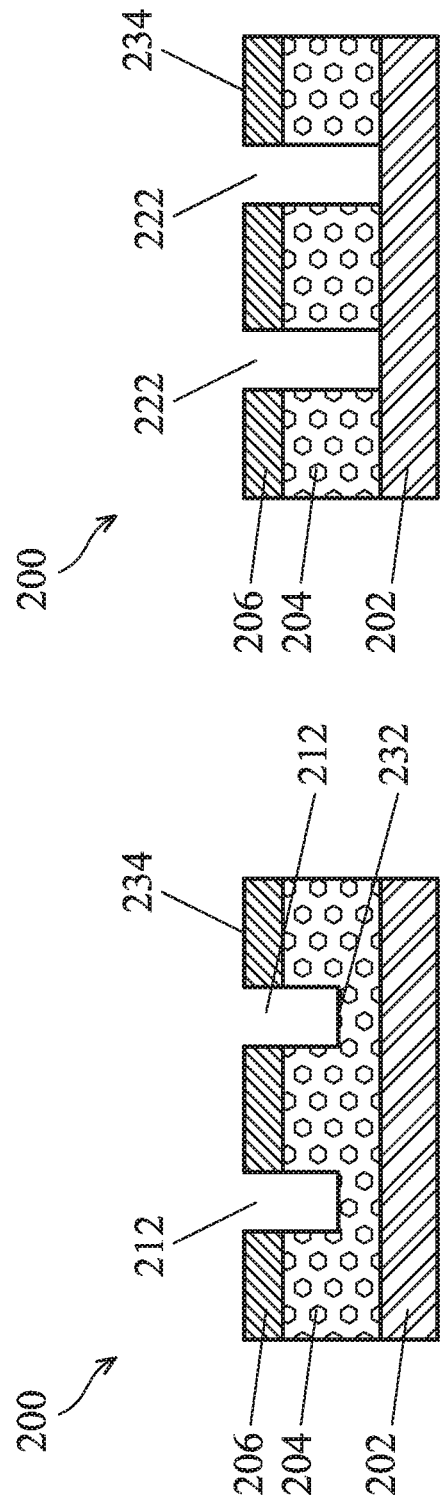
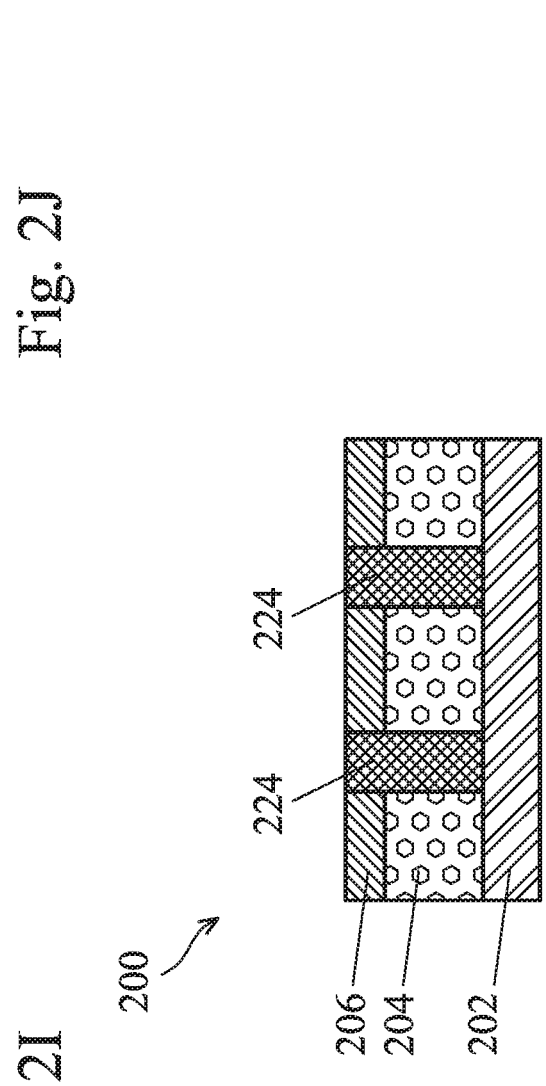

METHODS OF DEFECT INSPECTION

CROSS-REFERENCE TO RELATED APPLICATIONS

This application claims priority to U.S. Provisional Patent Application Ser. No. 62/550,113, filed on Aug. 25, 2017, which herein is incorporated by reference.

BACKGROUND

Semiconductor integrated circuits (ICs) are fabricated by a variety of processes for patterning, deposition, removal, and modification. Quality inspections are carried out during various stages of fabrication. For example, after-etch-inspection (AEI) is usually performed to monitor pattern defects in a patterning process.

However, as the dimension of the semiconductor integrated circuit shrinks, it becomes more challenging to capture defects using traditional defection inspection methods. Accordingly, there is a need for an improved defect inspection method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2K are schematic partial views of a semiconductor device at various stages of fabrication according to embodiments of the present disclosure.

DETAILED DESCRIPTION

Figure 1:
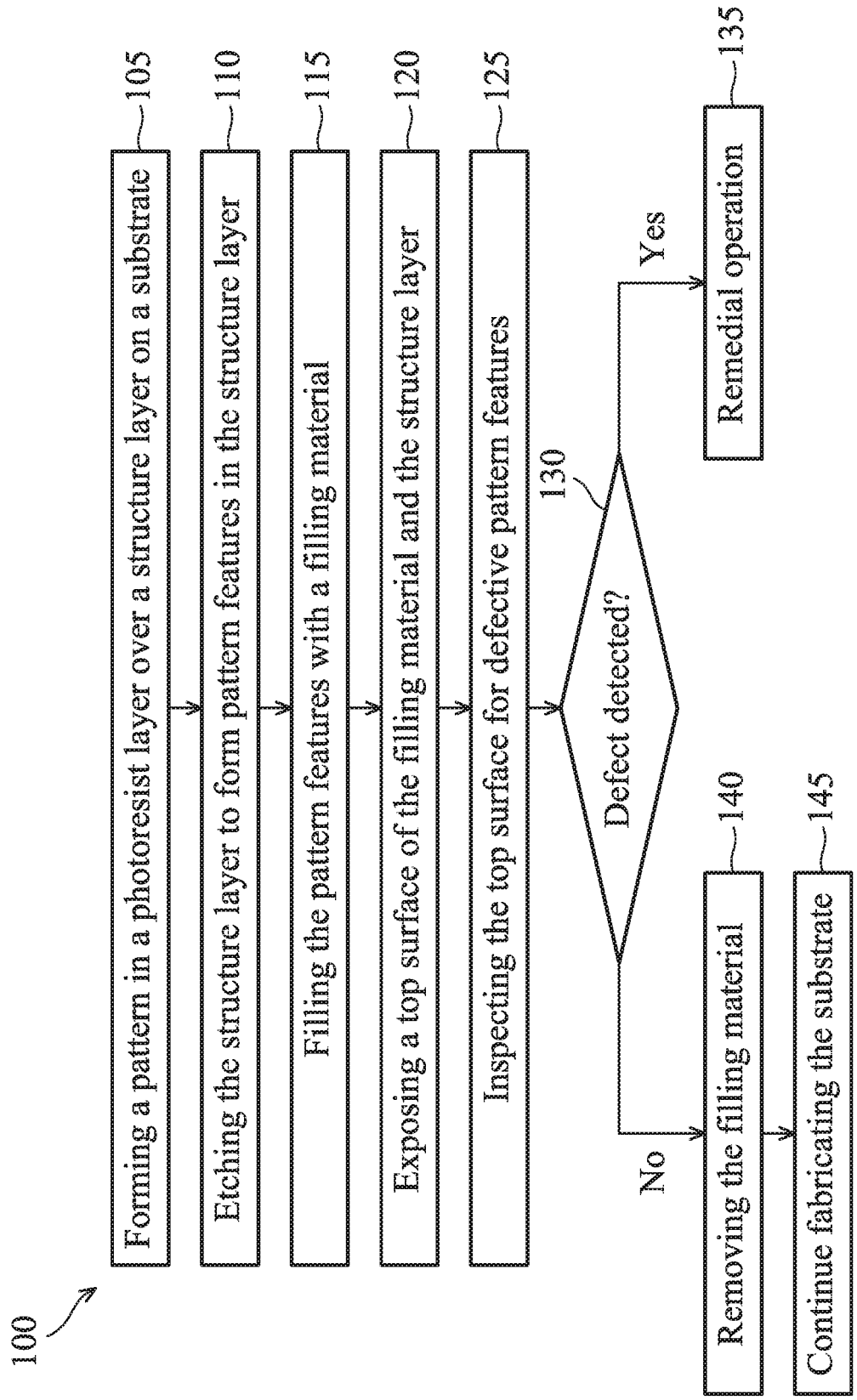
FIG. 1 is a schematic flow chart of a method according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating an exemplary method 100 for fabricating a semiconductor device according to various embodiments of the present disclosure. FIGS. 2A-2K are schematic partial views of a semiconductor structure 200 at various stages of fabrication according to the flow chart of FIG. 1. Those skilled in the art should recognize that the full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

The semiconductor structure 200 may be any suitable structures formed on a semiconductor substrate, such as a shallow trench isolation (STI) structure with diffusion regions (e.g., active regions) formed therebetween, an interconnection structure with conductive and non-conductive areas, a fin structure formed around shallow trench isolation structure, such as a Fin Field Effect Transistor (FinFET) structure, a gate structure, a contact structure, a front-end structure, a back-end structure, or any other suitable structures utilized in semiconductor applications.

The method 100 begins with operation 105 by forming a pattern in a photoresist layer 208 on a substrate 202, as shown in FIG. 2A. Exemplary materials for the substrate 202 include materials selected from at least one of crystalline silicon, silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass and sapphire. It is contemplated that the substrate 202 is not limited to any particular size or shape. Therefore, the substrate 202 may be a circular substrate having a 200 mm diameter, a 300 mm diameter or other diameters, such as 450 mm, among others. The substrate 202 may also be any polygonal, square, rectangular, curved or otherwise non-circular workpiece.

The semiconductor structure 200 may include a first structure layer 204 formed over the substrate 202. It is noted that additional structures, material layers, or device structures may be pre-formed on the substrate 202 prior to forming the first structure layer 204 so as to facilitate operation and proper function of the semiconductor device including the semiconductor structure 200. For example, a front end structure, such as a gate structure, a contact structure, or other suitable structures may be pre-formed on the substrate 202 prior to forming the first structure layer 204.

The first structure layer 204 may be a doped oxide layer disposed around a gate structure or an interlayer dielectric layer in an interconnect structure. In some embodiments, the first structure layer 204 is a low-k dielectric layer, such as thermal silicon oxide, phosphorous-doped silicate glass (PSG), silicon oxyfluoride (FSG), hydrogen sislsesquioxane (HSQ), nanoporous silica, polyaryleneether (PAE), fluorinated amorphous carbon (α-CF), or other materials suitable for use as an interlayer dielectric. In one embodiment, the first structure layer 204 is a PSG layer formed by a chemical vapor deposition (CVD) process using tetra-ethyl-orthosilicate (TEOS) as a precursor.

A second structure layer 206 is formed over the first structure layer 204. The second structure layer 206 may be any structure layer to be patterned, for example to be patterned using a photoresist layer. The second structure layer 206 may be an interlayer dielectric layer, a cap oxide layer, a hard mask layer, a polysilicon layer, and the like. The second structure layer 206 may be formed using any suitable techniques, such as a CVD process, a plasma enhanced chemical vapor deposition process (PECVD), or an epitaxial deposition process.

In some embodiments, the second structure layer 206 may be a silicon oxide layer, such as an un-doped silicate glass (USG) cap oxide layer. The USG cap oxide layer may be formed by a PECVD process using TEOS as a precursor. In other embodiments, the second structure layer 206 may be a silicon nitride layer, a metal nitride layer, a silicone layer, or a metal oxide layer.

At operation 105, the photoresist layer 208 is coated over the second structure layer 206 to transfer a pattern to the second structure layer 206. As shown in FIG. 2A, pattern features 210 are formed in the photoresist layer 208 using a photolithography process, whereby a geometric pattern is transferred from a photomask to a photoresist layer on a substrate. The photolithography process may be performed over the whole substrate 202 or over a portion of the substrate 202.

The photolithography process used in operation 105 may be any suitable photolithography processes, such as ultraviolet (UV) photolithography, immersion photolithography, and ultraviolet (EUV) photolithography depending on the minimum feature size, also called the critical dimension (CD) of the pattern to be formed. The critical dimension of the pattern features 210 may be a diameter of the pattern feature when the pattern feature is a hole, a line width when the pattern feature 210 is a line, or two times the half pitch of repeating pattern features 210. In FIG. 2A, the pattern features 210 are holes having an after development critical dimension 226. It should be noted that the pattern features 210 may be any suitable features to achieve intended functions of the semiconductor structure 200.

In one embodiment, the critical dimension 226 of the pattern features 210 may be less than about 30 nanometer. For example, the critical dimension 226 of the pattern features 210 is in a range from about 30 nanometer to about 16 nanometer. The pattern features 210 may be formed by an EUV photolithography. The EUV photolithography may be performed using a light source having a wavelength about 13.5 nanometer or less.

During semiconductor manufacturing, an after-develop inspection (ADI) may be performed to monitor the patterning process and reduce patterning defects in the photolithography process. However, after-develop inspection is a challenging inspection because the pattern features in the photoresist layer have low contrast and the transparent photoresist layer can cause prior level defects to be confused with defects in the photoresist layer. After-develop inspection becomes even more challenging as the critical dimension shrinks, such as in the patterns formed by an EUV photolithography process. Embodiments of the present disclosure provide an inspection method for monitoring the patterning process after transferring the pattern features 210 in the photoresist layer 208 to the second structure layer 206 beneath the photoresist layer 208.

In operation 110, a suitable etch process is performed to transfer the pattern features 210 in the photoresist layer 208 to the second structure layer 206. Pattern features 212 are formed in the second structure layer 206 as shown in FIG. 2B. The pattern features 212 may have an after-etch critical dimension 228. Even though a difference between the critical dimension 228 and the critical dimension 226, known as critical dimension (CD) bias, exists, operations are typically taken to control CD bias and measurement of the critical dimension 228 can be used to monitor patterning defects in the patterning process.

The etch process may be a dry etch process. In one embodiment, an reactive ion etch (RIE) may be used to etch the second structure layer 206 including silicon oxide formed by PECVD. Particularly, a mixture of processing gases including carbon tetrafluoride ($CF_4$) and Carbon trifluoride ($CHF_3$) may be used in a RIE chamber to remove the second structure layer 206 using the patterned photoresist layer 208 as a mask.

The pattern features 212 also have a depth 230. In some embodiments, a depth 230 of the pattern features 212 is only a portion of an intended depth in production manufacturing. For example, during production manufacturing, an etch process performed after the photolithography process in operation 105 would use the substrate 202 as an etch stop and end after etching through both the second structure layer 206 and the first structure layer 204. The etch process in operation 110 may stop when the depth 230 of the pattern features 212 is sufficient for an inspection tool to measure the after-etch critical dimension 228. For example, the depth 230 may be greater than about 1.5 of the critical dimension 226. In some embodiments, the depth 230 may be between about 1.5 to about 3.0 of the critical dimension 226. For pattern features having a critical dimension of about 30 nanometer, the depth 230 may be greater than 45 nanometer, for example between about 45 nanometer to about 90 nanometer.

The depth 230 may be achieved by controlling operation time using estimated or measured etch rate. For example, the dry etch process using a mixture of processing gases including carbon tetrafluoride ($CF_4$) and Carbon trifluoride ($CHF_3$) to silicon oxide formed by PECVD may be performed for a period between 22 to 45 seconds when the estimated etch rate is about 2 nanometers/second.

As shown in FIG. 2B, the pattern features 212 may have a bottom surface 232 in the first structure layer 204. Alternatively, the bottom surface 232 of the pattern features 212 may be in the second structure layer 206. Alternatively, the bottom surface 232 of the pattern features 212 may be the substrate 202.

The semiconductor structure 200 as shown in FIG. 2B may be inspected at this time for defects using an inspection tool during an after etch inspection (AEI). An inspection tool typically impinges a radiation towards the semiconductor structure 200 and detects reflected and/or scattered radiation from the semiconductor structure 200 to generate an optical image. The detected radiation depends on optical properties, such as refractive index of the surface structure. Because the pattern features 212 are hollow volumes in the second structure layer 206, optical properties of air reflect the patterned features 212 while optical properties of the second structure layer 206 reflect as the background. However, when the optical properties of the second structure layer 206 are similar to that of air, it is difficult to distinguish the pattern features 212 from the background, i.e., the second structure layer 206.

In operation 115, the pattern features 212 are filled with a dummy filling material 214 as shown in FIG. 2C. The dummy filling material 214 is selected so that the dummy filling material 214 and the second structure layer 206 have dissimilar optical properties to increase contrast in the inspection results. In one embodiment, an optical property of the dummy filling material 214 and the material in the second structure layer 206 is considered dissimilar when the difference in their optical properties is greater than a threshold value in a spectrum used by an inspection tool. For example, the threshold value may be in a range between about 10% to about 50% of the optical property value of the material in the second structure layer 206. In some embodiments, the threshold value may be about 30% of the optical property value of the material in the second structure layer 206. For example, the dummy filling material 214 may be selected to have a dissimilar complex refractive index, refractive index, extinction coefficient, permittivity, reflection coefficient, or combinations thereof compared to the second structure layer 206. In some embodiments, the dummy filling material 214 is selected to have a dissimilar refractive index to that of the second structure layer 206 in a wavelength or spectrum used by an inspection tool. The dissimilar refractive indexes enable increased contrast in an inspection image thus, improving defect capture rate.

One of more optical properties, including but not limited to a dissimilar complex refractive index, refractive index, extinction coefficient, permittivity, reflection coefficient, of the dummy filling material 214 are in a range from 0% to about 90% or in a range from about 110% to 1,000% of the same properties of the material in the second structure layer. For example, one of more optical properties, including but not limited to a dissimilar complex refractive index, refractive index, extinction coefficient, permittivity, reflection coefficient, of the dummy filling material 214 are in a range from 0% to about 70% or in a range from about 130% to 250% of the same properties of the material in the second structure layer 206. In an embodiment, the permissivity of the dummy filling material 214 is in a range from about 130% and 250% of air.

In the case when the second structure layer 206 includes silicon oxide, the dummy filling material 214 may be a bottom anti-reflective coating (BARC) material, a silicon based material, such as amorphous silicon and silicon nitride, a metal oxide, such as aluminum oxide and hafnium oxide, a metal nitride, such as titanium nitride and tantalum nitride, a metal, such as copper and tungsten, and combination thereof, or other suitable materials with dissimilar optical properties. The dummy filling material 214 may be formed by a coating process, an atomic layer deposition (ALD) process, a CVD process, a PVD process, or other suitable processes for the material type.

Exemplary BARC material includes silicon oxide, silicon oxycarbide, silicon oxynitride, hydrocarbon-containing silicon oxide, silicon nitride, titanium nitride, tantalum nitride, titanium containing material, tantalum containing material, an organic material, and any combination thereof. The BARC material may be formed over the second structure layer 206 using any suitable technique, such as CVD, PECVD, high-density plasma CVD (HDP-CVD), or spin coating process.

In one embodiment, the dummy filling material 214 may be an organic polymeric BARC, such as a highly cross-linking organic polymer known in the industry as BARCs. In some embodiments, the dummy filling material 214 includes BARCs with monomer units having hydroxyl groups. In some embodiments, the dummy filling material 214 includes BARCs with monomer units that undergo hydration when exposed to water at a suitable pH value. In some embodiments, the dummy filling material 214 includes BARCs with monomer units that have alkenes, alkynes, or aromatic groups. In some embodiments, the dummy filling material 214 includes BARCs containing ester, acrylate, or isocyanate monomers. In some embodiments, the dummy filling material 214 includes BARCs containing an acrylate polymer or copolymer. In some embodiments, the dummy filling material 214 includes BARCs containing an aromatic monomer. In some embodiments, the dummy filling material 214 includes BARCs containing a styrene polymer or copolymer. In some embodiments, the dummy filling material 214 includes BARCs containing hydroxyl groups, or capable of acquiring hydroxyl groups through a hydration reaction, can react with oxide abrasive particles in a dehydration reaction or bind to the abrasive particles through ether linkages during a CMP process.

In some embodiments, a BARC material, is selected as the dummy filling material 214 when the second structure layer 206 includes silicon oxide formed using TEOS precursor. The BARC material may be applied to the second structure layer 206 using a spin coating process.

In one embodiment, the second structure layer 206 includes silicon oxide formed using TEOS precursor and the dummy filling material 214 is an amorphous silicon. The amorphous silicon may be formed by a CVD process, for example with a CVD process using silane ($SiH_4$) gas as a silicon source.

In operation 120, excess dummy filling material 214 on the second structure layer 206 in FIG. 2C is removed. After removal, the second structure layer 206 is exposed, as shown in FIG. 2D. In FIG. 2D, a top surface 234 is exposed for inspection. The top surface 234 includes the second structure layer 206 and the dummy filling materials 214 in pattern features 216, which reflects the shape of the pattern features 212 at the top surface 234.

Figure 2E:
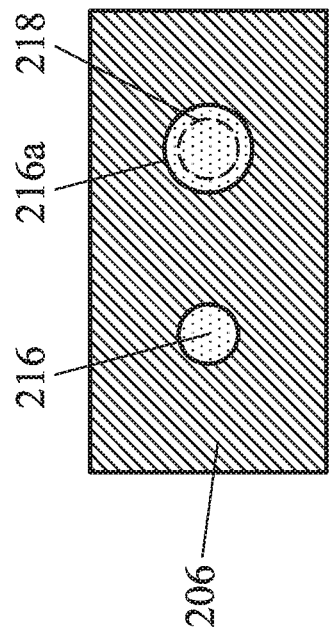

FIG. 2E is a schematic top view of the semiconductor structure 200. FIG. 2E shows the top surface 234 of the dummy filling material 214 in the pattern features 216 and the top surface of the second structure layer 206 as the background areas. The pattern features 216 shown in FIG. 2E are circular holes. It is noted that the pattern features 216 may be lines, rectangular holes, or other suitable shapes reflecting the corresponding pattern features 212.

In operation 120, the excess dummy filling material 214 may be removed using a planarization process, such as a chemical mechanical polishing (CMP) process, or an etch process, such as an ashing process. An end point detection may be used in operation 120. For example, when a CMP process is used in operation 120, consumed polishing fluid may be monitored for an end point. When the consumed polishing fluid includes both materials from the second structure layer 206 and the dummy filling material 214 and a ratio of the dummy filling material 214 over the material from the second structure layer 206 reflects a ratio of pattern areas and background areas, an end point of the CMP process is detected. Similarly, when an etch process is used in operation 120, an exhaust flow of the etch chamber may be monitored. When the exhaust flow includes both by-products from etching the second structure layer 206 and the by-products from etching the dummy filling material 214 and a ratio of the by-products from the dummy filling material 214 over the byproducts from the second structure layer 206 reflects a ratio of pattern areas and background areas, an end point of the etching process is detected.

In one embodiment, the dummy filling material 214 includes an organic polymeric BARC material, and the excess dummy filling material 214 may be removed using an etch process, such as an etching process using plasma of oxygen. In some embodiments, the dummy filling material 214 includes amorphous silicon, and the excess dummy filling material 214 may be removed using a CMP process.

In operation 125, the pattern features 216 may be inspected for defects using an inspection tool. The pattern features 216 may be inspected by impinging a radiation towards the top surface 234 of the semiconductor structure 200 shown in FIG. 2D and detecting radiation reflected and/or scattered by the semiconductor structure 200.

A suitable inspection tool may be a scanning surface inspection system (SSIS), such as a bright field imaging system and a dark field imaging system, a scanning electron microscope (SEM) system, an optical microscope system, a scanning probe microscope system, a laser microscope system, a transmission microscope system, a focus ion beam microscope system, or other suitable imaging system.

In operation 125, the semiconductor structure 200 is positioned in an inspection tool. The inspection tool impinges radiation in an inspection wavelength or an inspection spectrum towards the semiconductor structure 200 in a scanning manner. The inspection tool detects the radiation reflected and/or scattered by the semiconductor structure 200 to generate an optical image reflecting the top surface 234 as shown in FIG. 2E.

Because the dummy filling material 214 in the pattern features 216 and the materials in the second structure layer 206 have dissimilar refractive indexes, the image captured by the inspection tool also includes a detectable contrast between the pattern features 216 and the second structure layer 206. The detectable contrast is especially useful for pattern features with a small critical dimension.

As discussed above, the dummy filling material 214 may be selected to have a dissimilar optical property, such as complex refractive index, refractive index, extinction coefficient, permittivity, reflection coefficient, or combinations thereof, compared to the second structure layer 206. When an electromagnetic wave propagates through a material, the material attenuates the electromagnetic wave. A complex refractive index $\underline{n}$ of a material is used to define how the material attenuates electromagnetic waves passing through. Accordingly, the complex refractive index of the second structure layer 206 may be used as a basis for selecting a dummy filling material. The larger the difference between the complex refractive indexes, the bigger the contrast between the pattern areas and the background areas, i.e., second structure layer 206, in the inspection image.

The complex refractive index $\underline{n}$ includes the real part n and the imaginary part $\kappa$:

$$\underline{n} = n + i\kappa$$

The real part n is called the refractive index and indicates the phase velocity. The imaginary part $\kappa$ is called the extinction coefficient or mass attenuation coefficient and indicates the amount of attenuation when an electromagnetic wave propagates through a material. Thus, the real part and/or the imaginary part of the complex refractive index $\underline{n}$ may be used as a basis for selecting the dummy filling material 214.

Similarly, the relative permittivity $\varepsilon_r$ or dielectric constant (K) of a material can also be used to select the dummy filling material 214 as the relative permittivity relates to the refractive index n and the relative magnetic permeability $\mu_r$:

$$n^2 = \varepsilon_r \mu_r$$

Since most material are only slightly magnetic $\mu_r \cong 1$, and $$\varepsilon_r \cong \sqrt{n}.$$

Figure 3B:
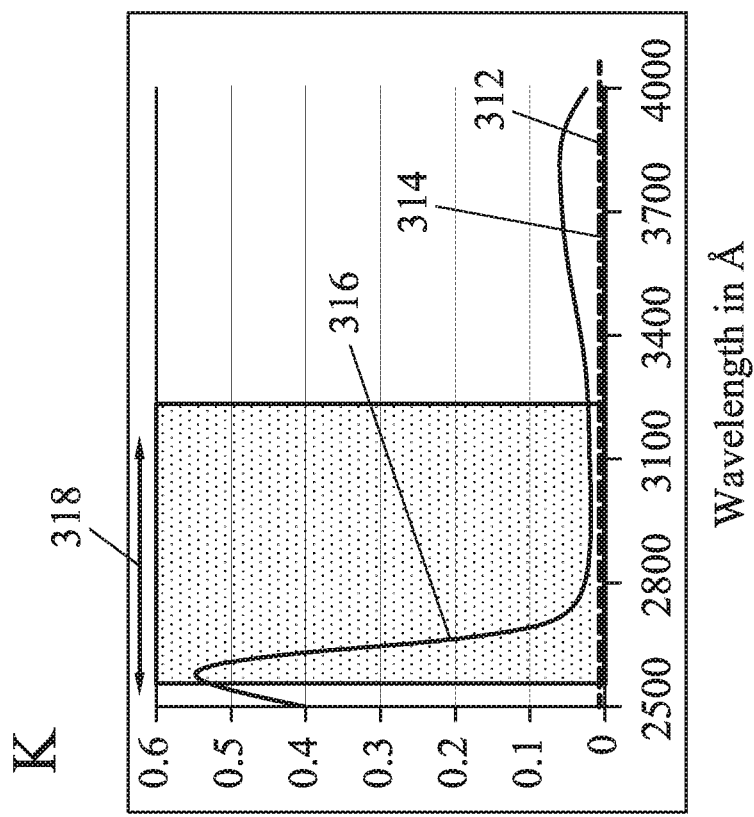
FIGS. 3A-3D are charts of optical properties of a structure layer and a dummy filling material according to embodiments of the present disclosure.
Figure 3A:
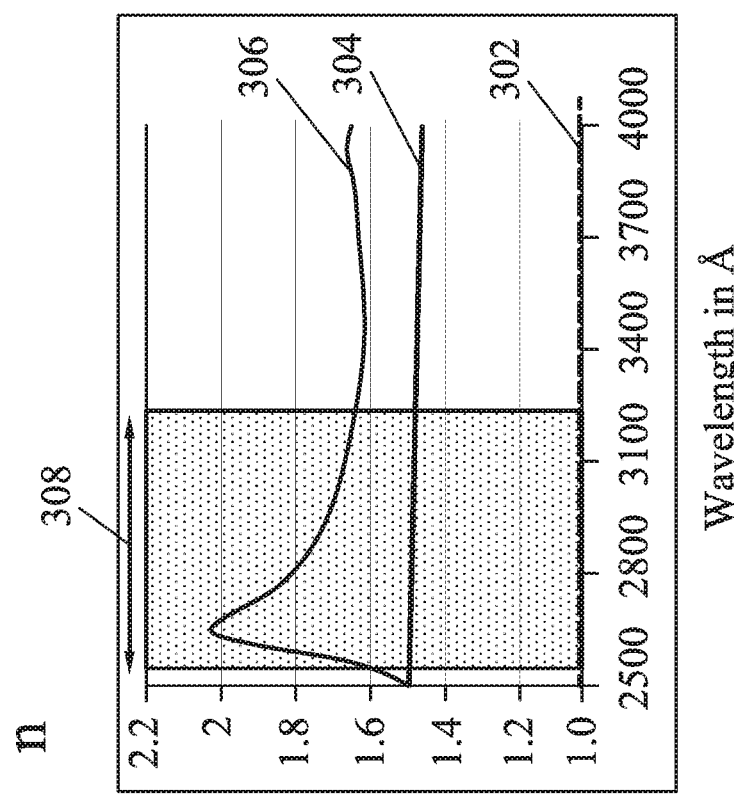

FIG. 3A is a chart of the refractive indexes n of a silicon oxide formed for TEOS precursor, a BARC material, and air. Curve 302 is the refractive index of air for electromagnetic waves in the wavelength between 2500 Å and 4000 Å. Curve 304 is the refractive index of a silicon oxide layer formed from TEOS precursor for electromagnetic waves in the wavelength between 2500 Å and 4000 Å. Curve 306 is the refractive index of a BARC material for electromagnetic waves in the wavelength between 2500 Å and 4000 Å. Spectrum 308 indicates an inspection spectrum of a suitable inspection tool. FIG. 3A illustrates the differences between the refractive indexes of the BARC material and air are greater than the differences between the refractive indexes of silicon oxide and air, particularly within the spectrum 308. Because of the differences in refractive indexes between the BARC material and silicon oxide, using the BARC material as the dummy filling material 214 increases inspection contrast compared to leaving the pattern features 212 hollow with air.

FIG. 3B is a chart of the attenuation coefficients K of a silicon oxide formed for TEOS precursor, a BARC material, and air. Curve 312 is the attenuation coefficient of air for electromagnetic waves in the wavelength between 2500 Å and 4000 Å. Curve 314 is the attenuation coefficient of a silicon oxide layer formed from TEOS precursor for electromagnetic waves in the wavelength between 2500 Å and 4000 Å. Curve 316 is the attenuation coefficient of a BARC material for electromagnetic waves in the wavelength between 2500 Å and 4000 Å. Spectrum 318 indicates an inspection spectrum of a suitable inspection tool. As shown in FIG. 3B, the attenuation coefficients of air and silicon oxide are substantially the same for electromagnetic wave in the wavelength between 2500 Å and 4000 Å. The differences between the attenuation coefficients of the BARC material and air are much greater than the differences between the attenuation coefficients of silicon oxide and air, particularly within the inspection spectrum. Because of the differences in attenuation coefficients between the BARC material and silicon oxide, using the BARC material as the dummy filling material 214 greatly increases inspection contrast compared to leaving the pattern features 212 hollow with air.

When selecting the dummy filling material, the refractive index and the attenuation coefficient can be considered separately or in combination depending on the material in the structure layer, operational mechanism of the inspection tool, critical dimension of the pattern features, and other relevant factors.

In some embodiments, the inspection spectrum or an inspection wavelength may be selected according to the differences between the refractive indexes and/or the differences between the attenuation coefficients of the dummy filling material 214 in the pattern features 212 and the second structure layer 206 to capture the maximum contrast in the inspection images. For example, an inspection wavelength around 2700 Å, such as a wavelength between 2500 Å and 2800 Å may be used to inspect pattern features formed in a silicon oxide structure layer and filled with a BARC material. Similarly, an inspection spectrum around 2700 Å, such as a spectrum of wavelengths between 2500 Å and 2800 Å may be used to inspect pattern features formed in a silicon oxide structure layer and filled with a BARC material.

Figure 3D:
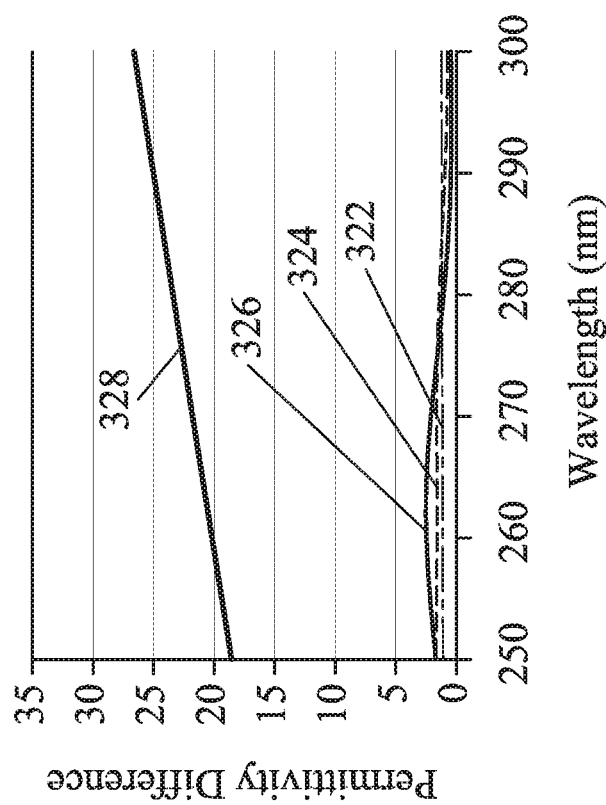
Figure 3C:
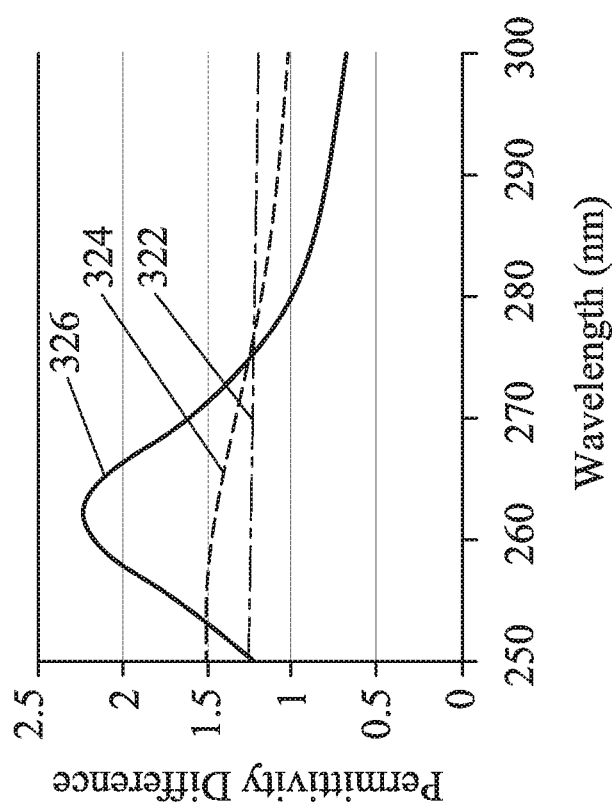

FIG. 3C is a chart of permittivity differences between two BARC materials and silicon oxide, and between air and silicon oxide. Curve 322 is the permittivity difference between air and silicon oxide for electromagnetic wave in the wavelength between 2500 Å and 3000 Å. The relative permittivity of air is nearly constant across the spectrum. Curve 324 is the permittivity difference between a first BARC material and silicon oxide for electromagnetic wave in the wavelength between 2500 Å and 3000 Å. Curve 326 is the permittivity difference between a second BARC material and silicon oxide for electromagnetic wave in the wavelength between 2500 Å and 3000 Å. The permittivity differences between BARCs and silicon oxide fluctuate across the spectrum. The BARC materials may be used as a dummy filling material in pattern features formed in a material having similar permittivity as air, such as silicon oxide, to increase contrast in inspection images. When a suitable inspection wavelength is selected, such as a wavelength near 2600 Å, the first BARC material increases signal intensity by about 20%, and the second BARC material increases signal intensity or intensity of detected electromagnetic wave by about 75%.

FIG. 3D is a chart of the relative permittivity difference between amorphous silicon and silicon oxide comparing to the permittivity differences between the two BARC materials, air and silicon oxide. Curve 328 is the permittivity difference between amorphous silicon and silicon oxide for electromagnetic wave in the wavelength between 2500 Å and 3000 Å. As shown in FIG. 3D, the permittivity difference between amorphous silicon and silicon oxide is about 20 times greater than the permittivity difference between air and silicon oxide across the spectrum from 2500 Å and 3000 Å. When amorphous silicon is used as a dummy filling material in pattern features formed in a material having similar permittivity as air, the signal intensity or intensity of detected electromagnetic wave increases about twenty times.

The dissimilar optical properties between the second structure layer 206 and the dummy filling material 214 in the pattern features 212 enable increased contrast in the inspection image, schematically illustrated in FIG. 2E. The increased contrast improves defect capture rate of the inspection, especially when a critical dimension of the pattern features 216 is small. For example, when a target critical dimension is about 30 nm, a pattern feature is considered defective when the measured pattern feature is greater than about 43 nm.

Figure 2F:
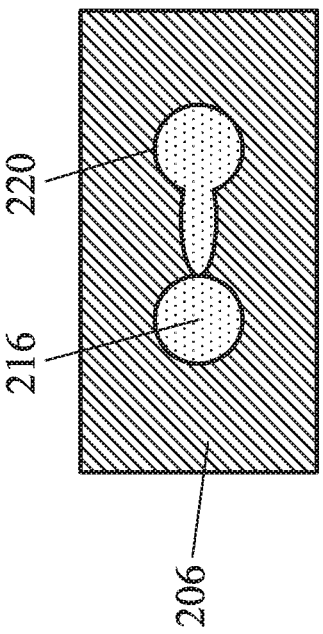
Figure 2G:
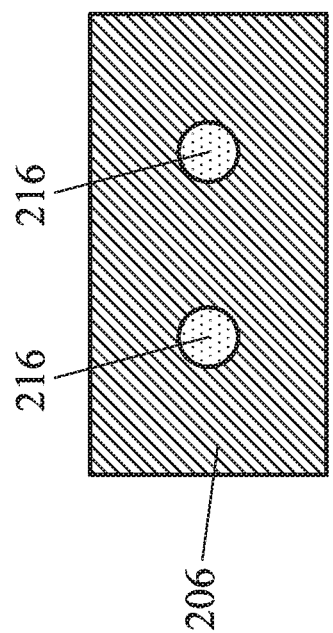
Figure 2H:
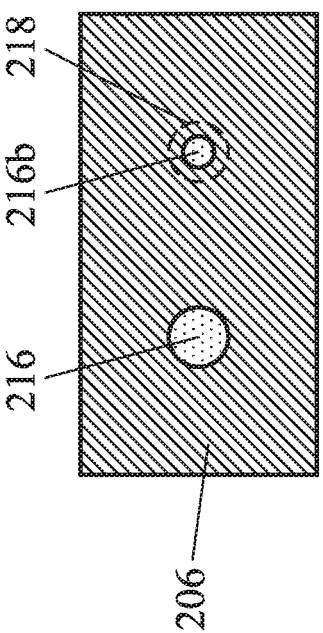

In operation 130, the inspection images may be analyzed to detect defects. FIGS. 2F-2H schematically illustrate typical defects in a pattern feature. FIG. 2F shows a pattern feature 216a having a critical dimension, i.e., diameter, larger than a critical dimension of a target pattern feature 218. An inspection tool having an image capture device, such as a CCD camera, and an image analyzing module, may be used to capture images of the pattern features 216 and detect any defects. The inspection tool may be a metrology tool, such as broadband plasma defect inspection tool, laser scanning inspection tools, light emitting diode (LED) scanning tools, or other suitable imaging inspection tools.

The inspection tool may include an inspection application to determine the difference between the critical dimension of the pattern feature 216a and the critical dimension of the target pattern feature 218. In the example of pattern feature 216a, the critical dimension is a diameter of the pattern feature 216a. The inspection application may analyze a captured image including the pattern feature 216a to extract the pattern feature 216a from the captured image and determine a critical dimension of the pattern feature 216a using image processing technologies. When the critical dimension of the pattern feature 216a in the inspection image is larger than the critical dimension of the target pattern feature 218 by a threshold level, the pattern feature 216a may be determined to be an oversize critical dimension type defect. The threshold value may be in a range from about 20% to about 40%. In one embodiment, the threshold value may be about 30%. In other words, when a pattern feature being inspected has a critical dimension at least 30% greater than the target critical dimension, the pattern feature is considered defective. For example, when a target critical dimension is about 30 nm, a pattern feature is considered defective when the measured pattern feature is more than about 40 nm.

FIG. 2G shows a pattern feature 216b having a critical dimension, i.e. diameter, smaller than the critical dimension of the target pattern feature 218. An inspection application may be used to determine the difference between the critical dimension of the pattern feature 216b and the critical dimension of the target pattern feature 218. When the critical dimension of the pattern feature 216b in the inspection image is smaller than the critical dimension of the target pattern feature 218 by a threshold level, the pattern feature 216a may be determined to be an undersize critical dimension type defect. The threshold value may be in a range from about 20% to about 40%. In one embodiment, the threshold value may be about 30%. In other words, when a pattern feature being inspected has a critical dimension at least 30% smaller than the target critical dimension, the pattern feature is considered defective.

FIG. 2H shows two pattern features 216 and 220 that are connected to each other or a distance separating two pattern areas is smaller than a threshold value, thereby forming an intrusive type defect. An inspection application may be used to determine whether two neighboring pattern features have an intrusive type defect. For example, when the distance separating two pattern features is smaller than about the critical dimension of the pattern features, an intrusive type defect is detected between the two pattern areas. When unintended connection between neighboring pattern features are detected, the pattern features are considered defective with an intrusive type defect.

In operation 135, remedial processes may be performed when defects, such as oversize critical dimension type defect, undersize critical dimension type defect, and intrusive type defects, are detected. Remedial processes may be performed for processes in used in operation 105, for example, recalibrating the photolithography tool, realignment of a photolithography mask, and readjusting exposure and developing recipes.

In some embodiments, operations 110, 115, 120, 125, and 130 may be performed periodically on a sample substrate from a production substrate stream for spot checking. In some embodiments, the inspected substrate may be discarded after operations 125 and 130. In other embodiments, when no defects are detected in operation 130, operations 140 and 145 may be performed to return the inspected sample substrate back to the production substrate stream.

In operation 140, the dummy filling material 214 may be removed from pattern feature 212. The dummy filling material 214 may be removed by an ashing process, a wet etching process, or a selective dry etching process. In one embodiment, when the dummy filling material 214 is a BARC material, an ashing process using oxygen plasma may be used to remove the dummy filling material from the pattern feature 212. In other embodiment, a wet etching process may be performed to selectively remove the dummy filling material 214 when the dummy filling material 214 is a silicon based material, a metal oxide, a silicon nitride, a metal nitride or a metal. In other embodiments, the dummy filling material 214 may be removed using a selective dry etch when the dummy filling material 214 is a silicon based material, a metal oxide, a silicon nitride, a metal nitride or a metal.

FIG. 2I shows the semiconductor structure 200 after the dummy filling material 214 has been removed. In FIG. 2I, the pattern feature 212 has not been formed as deep as the intended depth for production substrates. In one embodiment, an etch process may be performed to etch the pattern feature 212 through the first structure layer 204 using the second structure layer 206 as a hard mask. FIG. 2J shows complete pattern features 222.

In operation 145, the semiconductor structure 200 is returned to production stream and the pattern features 222 may be filled with a production material. The production material indicates the intended material for the pattern features 222 in production substrates so that the semiconductor structure 200 can function as designed. For example, when the pattern features 222 are vias in an interlayer dielectric, the production material may be a metal, such as copper. In some embodiments, the pattern feature 222 may be a trench or a via for interlayer connection, and may be filled with copper 224 by the production operations. In other embodiments, the pattern features 222 may be a gate contact for a transistor, and may be filled with a conductive material, such as copper.

Embodiments of the present disclosure provide an improved method for process defect inspection. After pattern features are formed in a structure layer, a dummy filling material having dissimilar optical properties from the structure layer is filled in the pattern features. The dissimilar optical properties between materials in the pattern features and the structure layer increase contrast in images captured by an inspection tool, thus increasing the defect capture rate. The inspection methods according to the present disclosure improving defect capture rates particularly when the structure layer includes materials having optical properties similar to air, and when the critical dimension of the pattern features is small, such as smaller than 30 nanometer.

Some embodiments provide a method for inspecting defects after a photolithography process. The method includes etching a structure layer under a patterned photoresist layer to transform pattern features from the patterned photoresist layer to the structure layer, wherein the structure layer comprises a first material, filling the pattern features in the structure layer with a dummy filling material, wherein the first material and the dummy filling material have dissimilar optical properties, exposing a top surface of the structure layer containing the first material and the pattern features containing the dummy filling material, and inspecting the top surface for defective pattern features using an inspection tool.

Some embodiments provide a method for manufacturing a semiconductor device. The method includes forming a first structure layer over a substrate, forming a second structure layer over the first structure layer, wherein the second structure layer comprises a first material, applying a photoresist layer over the second structure layer, patterning the photoresist layer using a photolithography process, etching through the second structure layer and a portion of the first structure layer using the patterned photoresist layer as a mask to form pattern features, filling the pattern features with a dummy filling material, wherein the dummy filling material and the first material have dissimilar optical properties, removing excess dummy filling material to expose a top surface of the first material and the dummy filling material, and inspecting the top surface for defects in the pattern features.

Some embodiments provide a method for semiconductor processing. The method includes forming pattern features in a silicon oxide layer, filling the pattern features with a dummy filling material having optical properties dissimilar to silicon oxide, inspecting filled pattern features for defects, removing the dummy filling material from the pattern features, and filling the pattern features with a production material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of inspecting defects after a photolithography process, comprising:
    etching a structure layer under a patterned photoresist layer to transform pattern features from the patterned photoresist layer to the structure layer, wherein the structure layer comprises a first material;
    filling the pattern features in the structure layer with a dummy filling material, wherein the first material and the dummy filling material have dissimilar optical properties, and the dummy filling material is to be removed from the pattern features;
    exposing a top surface of the structure layer containing the first material and the pattern features containing the dummy filling material, wherein the dummy filling material comprises an organic material;
    performing chemical mechanical polishing (CMP) so that a top surface of the organic material and a top surface of the pattern features are exposed; and
    inspecting the top surface for defective pattern features using an inspection tool.

2. The method of claim 1, wherein the organic material comprises an organic bottom anti-reflective coating (BARC) material.

3. The method of claim 2, wherein filling the pattern features comprises spin coating the dummy filling material over the structure layer.

4. The method of claim 1, wherein removing excess dummy filling material comprises etching the dummy filling material using a plasma of oxygen.

5. The method of claim 1, wherein the first material comprises silicon oxide.

6. The method of claim 1, wherein filling the pattern features comprises depositing the dummy filling material using a coating process.

7. The method of claim 6, wherein removing excess dummy filling material comprises removing the dummy filling material using an ashing process.

8. The method of claim 1, wherein the critical dimension of the pattern features ranges from about 30 nanometers to about 16 nanometers.

9. The method of claim 1, further comprising selecting an inspection wavelength or inspection spectrum by comparing one or more of complex refractive indexes, refractive indexes, attenuation coefficients, relative permittivities, reflection coefficients between the first material and the dummy filling material.

10. The method of claim 1, wherein a bottom of the pattern features is within the structure layer.

11. A method of manufacturing a semiconductor device, comprising:
forming a first structure layer over a substrate;
forming a second structure layer over the first structure layer, wherein the second structure layer comprises a first material;
applying a photoresist layer over the second structure layer;
patterning the photoresist layer using a photolithography process;
etching through the second structure layer and a portion of the first structure layer using the patterned photoresist layer as a mask to form pattern features;
filling the pattern features with a dummy filling material, wherein the dummy filling material and the first material have dissimilar optical properties;
removing excess dummy filling material to expose a top surface of the first material and the dummy filling material;
selecting an inspection wavelength or inspection spectrum by comparing attenuation coefficients, relative permittivities, or reflection coefficients between the first material and the dummy filling material; and
inspecting the top surface for defective pattern features, wherein a critical dimension of the pattern features inspected is less than 30 nanometers.

12. The method of claim 11, wherein the dummy filling material comprises one of a BARC material, a silicon based material, a metal oxide, a metal nitride, a metal, a silicon oxide, and a combination thereof.

13. The method of claim 11, wherein filling the pattern features comprises depositing the dummy filling material using a coating process, an atomic layer deposition (ALD) process, a chemical vapor deposition (CVD) process, and a physical vapor deposition (PVD) process.

14. The method of claim 11, wherein the first material comprises silicon oxide, the dummy filling material comprises a BARC material, and filling the pattern features comprises spin coating the dummy filling material over the second structure layer.

15. The method of claim 11, wherein the first material comprises silicon oxide, the dummy filling material comprises amorphous silicon, and filling the pattern features comprises forming amorphous silicon by a CVD process.

16. The method of claim 11, further comprising:
after inspecting the top surface, removing the dummy filling material from the pattern features; and
etching through the first structure layer using the second structure layer as a hard mask.

17. A method for semiconductor processing, comprising:
forming pattern features in a silicon oxide layer;
filling the pattern features with a dummy filling material having optical properties dissimilar to silicon oxide;
selecting an inspection wavelength or inspection spectrum by comparing attenuation coefficients, relative permittivities, or reflection coefficients between the silicon oxide and the dummy filling material;
inspecting filled pattern features for defects, wherein a critical dimension of the pattern features inspected is less than 30 nanometers;
removing the dummy filling material from the pattern features; and
filling the pattern features with a production material.

18. The method of claim 17, wherein the dummy filling material comprises one of a BARC material, a silicon based material, a metal oxide, a metal nitride, a metal, a silicon oxide, and a combination thereof.

19. The method of claim 17, wherein filling the pattern features comprises depositing the dummy filling material using a coating process, an atomic layer deposition (ALD) process, a chemical vapor deposition (CVD) process, and a physical vapor deposition (PVD) process.

* * * * *